US009329989B2

(12) United States Patent
Sprouse et al.

(10) Patent No.: US 9,329,989 B2
(45) Date of Patent: May 3, 2016

(54) SYSTEM AND METHOD FOR PRE-INTERLEAVING SEQUENTIAL DATA

(75) Inventors: Steven Sprouse, San Jose, CA (US); Yichao Huang, San Jose, CA (US)

(73) Assignee: SanDisk Technologies, Inc., Plano, TX (US)

( * ) Notice: Subject to any disclaimer, the term of this patent is extended or adjusted under 35 U.S.C. 154(b) by 138 days.

(21) Appl. No.: 13/341,704

(22) Filed: Dec. 30, 2011

(65) Prior Publication Data

US 2013/0173874 A1 Jul. 4, 2013

(51) Int. Cl.
| | |
|---|---|
| *G06F 12/00* | (2006.01) |
| *G06F 12/02* | (2006.01) |
| *G06F 12/06* | (2006.01) |
| *G11C 7/10* | (2006.01) |

(52) U.S. Cl.
CPC ........ *G06F 12/0246* (2013.01); *G06F 12/0607* (2013.01); *G11C 7/1042* (2013.01); *G06F 2212/1004* (2013.01); *G06F 2212/1016* (2013.01); *G06F 2212/7208* (2013.01)

(58) Field of Classification Search
CPC ............ G06F 12/0246; G06F 12/0607; G06F 9/3851; G06F 9/30189; G06F 11/1076; G06F 11/1641; G06F 2212/1016; G06F 2212/7202; G06F 15/80; G06F 8/453; G06F 12/0851; G06F 2212/7208; G06F 2212/1036; G06F 2212/2022; G06F 2212/214; G06F 2212/7211; G06F 3/0688; G06F 3/0613; G06F 3/0616; G06F 3/061; G06F 3/064; G06F 3/0685; G06F 11/1068; G06F 13/161
USPC .......... 711/101, 157, 103, E12.001, E12.008, 711/114, 170, 5, E12.079, 104; 365/185.11, 365/185.03; 712/229, 20
See application file for complete search history.

(56) References Cited

U.S. PATENT DOCUMENTS

| | | | |
|---|---|---|---|
| 6,763,424 B2 | 7/2004 | Conley | |
| 2005/0144357 A1 | 6/2005 | Sinclair | |
| 2005/0144361 A1* | 6/2005 | Gonzalez | ............ G06F 12/0246 711/103 |
| 2005/0251617 A1 | 11/2005 | Sinclair et al. | |

(Continued)

FOREIGN PATENT DOCUMENTS

| | | | |
|---|---|---|---|
| WO | 2004/040454 | 5/2004 | |
| WO | WO 2004040454 A2 * | 5/2004 | .......... G06F 12/0246 |
| WO | 2007/081638 A2 | 7/2007 | |

OTHER PUBLICATIONS

International Search Report issued in PCT/US2012/071290 dated May 17, 2013 (4 pgs).
Written Opinion of the International Searching Authority issued in PCT/US2012/071290 dated May 17, 2013 (5 pgs).
Chang, Li-Pin: "Efficient Management for Large-Scale Flash Memory Storage Systems With Resource Conservation", National Chiao-Tung University, Hsin-Chu, Taiwan, Nov. 2005, 37 pages.

(Continued)

*Primary Examiner* — Mark Giardino, Jr.
*Assistant Examiner* — Edward Waddy, Jr.
(74) *Attorney, Agent, or Firm* — Brinks Gilson & Lione (57) ABSTRACT

A method and system for operating a memory device in programming mode is disclosed. The memory device includes a programming mode and a normal mode. The memory device in programming mode increases the number of physical planes that can be programmed in parallel than can be programmed in normal mode. In this way, the memory device may be programmed more quickly at various times of operation of the memory device (such as during manufacturing). The host system may send rearranged data to the memory device in programming mode with the rearranged data accounting for the increased number of physical planes programmed in parallel.

20 Claims, 7 Drawing Sheets

| Die 0 | | Die 1 | |
|---|---|---|---|
| Plane 0 | Plane 1 | Plane 0 | Plane 1 |
| 0 | 1 | 256 | 257 |
| 2 | 3 | 258 | 259 |
| 4 | 5 | 260 | 261 |
| ... | ... | ... | ... |
| 254 | 255 | 510 | 511 |

(56) References Cited

U.S. PATENT DOCUMENTS

| | | | |
|---|---|---|---|
| 2008/0034154 A1* | 2/2008 | Lee .................... G06F 12/0246 | 711/103 |
| 2008/0147968 A1* | 6/2008 | Lee et al. ....................... | 711/103 |
| 2009/0089482 A1* | 4/2009 | Traister ............... G06F 12/0246 | 711/103 |
| 2009/0157964 A1* | 6/2009 | Kasorla et al. ................ | 711/118 |
| 2009/0196102 A1 | 8/2009 | Kim | |
| 2010/0142270 A1 | 6/2010 | Shibata | |
| 2010/0169553 A1 | 7/2010 | Yano et al. | |
| 2010/0174847 A1* | 7/2010 | Paley et al. ................... | 711/103 |
| 2011/0153911 A1 | 6/2011 | Sprouse et al. | |
| 2012/0198131 A1* | 8/2012 | Tan et al. ...................... | 711/103 |

OTHER PUBLICATIONS

Lee, Yong-Goo et al.: "μ-FTL: A Memory-Efficient Flash Translation Layer Supporting Multiple Mapping Granularities", Korean Advanced Institute of Science and Technology, 2008, 10 pages.

U.S. Appl. No. 12/260,135, filed Oct. 29, 2008, "Method and Apparatus for Enforcing a Flash Memory Caching Policy", Inventors: Menahem Lasser, Izhak Afriat, Opher Lieber, 59 pages.

International Preliminary Report and Written Opinion of the International Searching Authority issued in corresponding PCT Application No. PCT/US2012/071290 dated Jul. 1, 2014 (6 pgs).

\* cited by examiner

| Die 0 | | | Die 1 | |
| --- | --- | --- | --- | --- |
| Plane 0 | Plane 1 | | Plane 0 | Plane 1 |
| 0 | 1 | | 256 | 257 |
| 2 | 3 | | 258 | 259 |
| 4 | 5 | | 260 | 261 |
| ... | ... | | ... | ... |
| 254 | 255 | | 510 | 511 |

*FIG. 6*

SYSTEM AND METHOD FOR PRE-INTERLEAVING SEQUENTIAL DATA

TECHNICAL FIELD

This application relates generally to memory devices. More specifically, this application relates to pre-interleaving sequential data to maximize parallel plane write performance while minimizing system metablock size.

BACKGROUND

Non-volatile memory systems, such as flash memory devices, have been widely adopted for use in consumer products. Flash memory devices may be found in different forms, for example in the form of a portable memory card that can be carried between host devices or as a solid state disk (SSD) embedded in a host device. When writing data to a conventional flash memory device, a host typically writes data to, and reads data from, addresses within a logical address space of the memory system.

The flash memory device includes an array of floating-gate memory cells and a system controller. The controller manages communication with the host system and operation of the memory cell array in order to store and retrieve user data. In order to increase the degree of parallelism during programming user data into the memory array and reading user data from it, the array is typically divided into sub-arrays, commonly referred to as planes, which contain their own data registers and other circuits to allow parallel operation such that sectors of data may be programmed to or read from each of several or all the planes simultaneously. An array on a single integrated circuit may be physically divided into the planes, or each plane may be formed from a separate one or more flash memory chips.

The memory cells of the flash memory device can be grouped together into pages and blocks. The page is the unit of data programming and reading within a block, containing the minimum amount of data that are programmed or read at one time. However, in order to increase the memory system operational parallelism, such pages within two or more blocks may be logically linked into metapages. A metapage may be formed of one physical page from multiple blocks. So that, the metapage, for example, may include the page in each of the multiple blocks but the pages of a metapage need not necessarily have the same relative position within each of the blocks. A metapage is the maximum unit of programming.

The block is composed of multiple pages with the block being the smallest grouping that is simultaneously erasable. To efficiently manage the memory, blocks may be linked together to form virtual blocks or metablocks. That is, each metablock is defined to include one block from each plane. Use of the metablock is described in U.S. Pat. No. 6,763,424, which is hereby incorporated by reference in its entirety, for all purposes. The metablock is identified by a host logical block address as a destination for programming and reading data. Similarly, all blocks of a metablock are erased together.

Metablock sizes are typically kept smaller in order to comply with various standards. However, a small metablock size reduces the number of planes that can be operated in parallel, thereby increasing the time in which to program the flash memory device. Thus, a need exists to reconcile these issues.

SUMMARY

In order to address the problems noted above, a method and system for controlling garbage collection in a memory device is disclosed.

According to a first aspect of the invention, a method of loading data in a memory device is disclosed. The method comprises, in a host system: accessing an indicator, the indicator indicative of a parallel plane structure of the memory device; using the indicator in order to obtain interleaved data, the interleaved data comprising a reordering of the data conforming to the parallel plane structure of the memory device in order for the memory device to program the interleaved data in parallel; and sending the interleaved data sequentially to the memory device. The indicator of the parallel plane structure of the memory device may comprise a type of memory device (such as a model number of the memory device) or the actual maximum number of planes that the memory device may program in parallel. The host system may use the indicator to obtain the interleaved data in one of several ways, such as using the indicator to access a memory location that has stored therein the interleaved data, or using the indicator to rearrange the data in order to generate the interleaved data.

According to a second aspect of the invention, a host system for loading data into a memory device is disclosed. The host system includes a memory and a controller in communication with the memory. The controller is configured to: access an indicator, the indicator indicative of a parallel plane structure of the memory device; use the indicator in order to obtain interleaved data, the interleaved data comprising a reordering of the data conforming to the parallel plane structure of the memory device in order for the memory device to program the interleaved data in parallel; and send the interleaved data sequentially to the memory device.

According to a third aspect of the invention, a method for a memory device to load data is disclosed. The method comprises, in the memory device: receiving a command to configure the memory device to programming mode; configuring the device for programming mode; receiving interleaved data; storing the interleaved data according to the programming mode; receiving a command to configure the device to normal mode; and configuring the memory device for normal mode, wherein the memory device in programming mode programs more planes in parallel than in the normal mode. For example, the memory device in programming mode programs the maximum number of planes in parallel.

According to a fourth aspect of the invention, a memory device for loading data therein is disclosed. The memory device includes a memory and a controller in communication with the memory. The controller is configured to: receive a command to configure the memory device to programming mode; configure the device for programming mode; receiving interleaved data; store the interleaved data according to the programming mode; receive a command to configure the device to normal mode; and configure the memory device for normal mode, wherein the memory device in programming mode programs more planes in parallel than in the normal mode.

BRIEF DESCRIPTION OF THE PRESENTLY PREFERRED EMBODIMENTS

Figure 1:
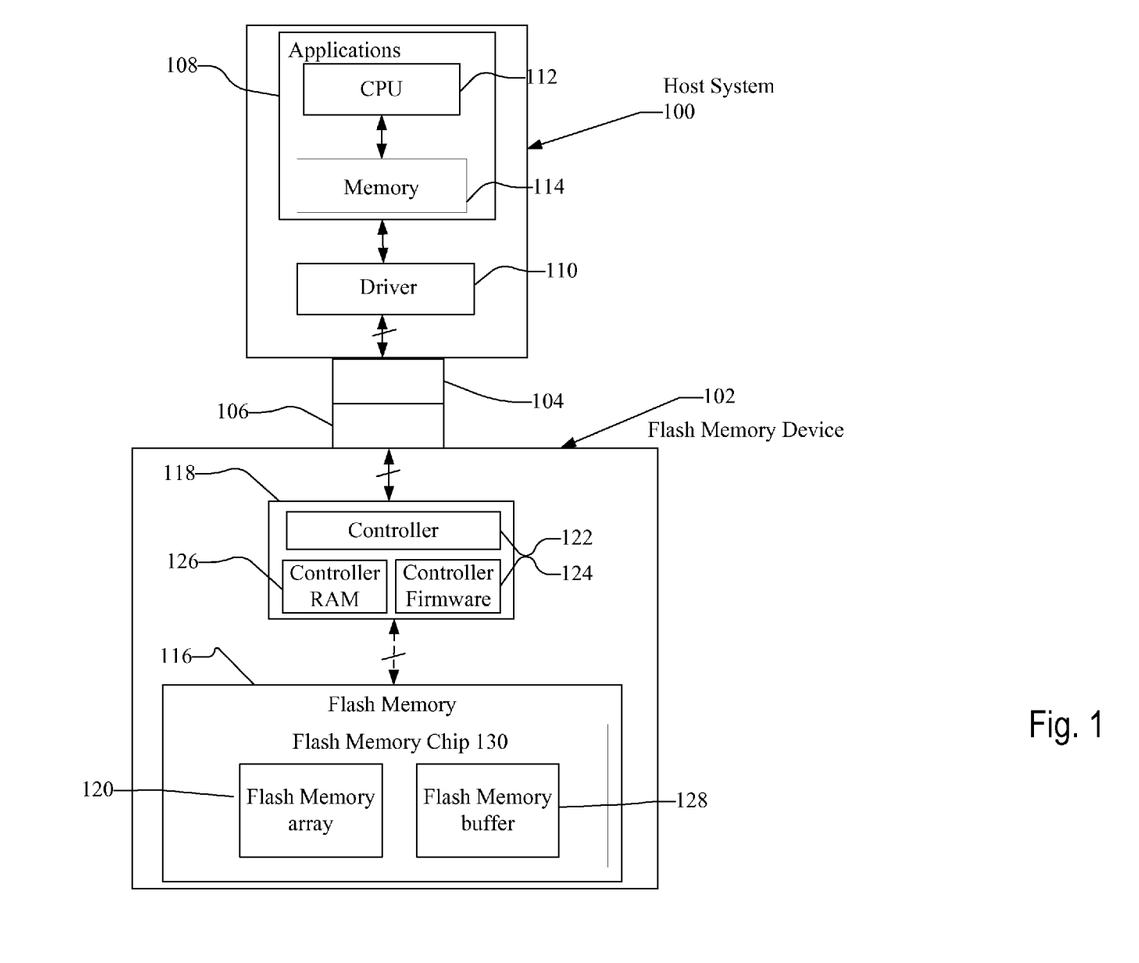
FIG. 1 is a block diagram of a host connected with a memory system having non-volatile memory.

A flash memory system suitable for use in implementing aspects of the invention is shown in FIGS. 1-5. A host system 100 of FIG. 1 stores data into and retrieves data from the flash memory device 102. The flash memory device 102 may be flash memory embedded within the host system, such as in the form of a solid state disk (SSD) drive installed in a personal computer, a computer server, or a storage array. Alternatively, the flash memory device 102 may be in the form of a card that is removably connected to the host system through mating parts 104 and 106 of a mechanical and electrical connector, such as illustrated in FIG. 1. A flash memory device configured for use as an internal or embedded SSD drive may look similar to the schematic of FIG. 1, with the primary difference being the location of the flash memory device 102 internal to the host system 100. SSD drives may be in the form of discrete modules that are drop-in replacements for rotating magnetic disk drives.

One example of a commercially available SSD drive is a 32 gigabyte SSD produced by SanDisk Corporation. Examples of commercially available removable flash memory cards include the CompactFlash (CF), the MultiMediaCard (MMC), Secure Digital (SD), miniSD, Memory Stick, SmartMedia, TransFlash, and microSD cards. Although each of these cards has a unique mechanical and/or electrical interface according to its standardized specifications, the flash memory device included in each is similar. Further, the flash memory device may be hand held memory systems in small packages that have a Universal Serial Bus (USB) plug for connecting with a host by plugging into the host system's USB receptacle. Each of these memory cards and flash drives includes controllers that interface with the host and control operation of the flash memory within them.

The host system 100 of FIG. 1 may be viewed as having two major parts, insofar as the flash memory device 102 is concerned, made up of a combination of circuitry and software. They are an applications portion 108 and a driver portion 110 that interfaces with the flash memory device 102. In a PC, for example, the applications portion 108 can include a processor, such as CPU 112 and a memory 114. The memory 114 stores one or more programs for execution by the CPU 112, the execution of which runs various functionalities of a computing device. For example, the memory may include software (such as computer readable instructions) that when executed by the CPU 112 includes the following functionalities: programming (such as programming of the flash memory device 102 in a programming mode, as discussed below); word processing; graphics; control or other popular application software; as well as a file system for managing data on the host system 100. The memory may comprise volatile and/or non-volatile memory, and may store information other than software, such as data relating to a mode of the flash memory device 102, as discussed in more detail below.

In a manufacturing computer that is primarily dedicated to perform a single set of set of functions, the applications portion 108 include the software that operates the manufacturing computer to program the flash memory device 102, and the like. In a camera, cellular telephone or other host system that is primarily dedicated to perform a single set of functions, the applications portion 108 includes the software that operates the camera to take and store pictures, the cellular telephone to make and receive calls, and the like.

The flash memory device 102 of FIG. 1 may include non-volatile memory, such as flash memory 116, and a system controller 118. The system controller 118 controls the flash memory 116 and communicates with the host system 100 to which the flash memory device 102 is connected in order to pass data back and forth. The system controller 118 may convert between logical addresses of data used by the host system 100 and physical addresses of the flash memory 116 during data programming and reading.

The flash memory 116 may include one or more flash memory chips 130. The flash memory chip 130 includes a flash memory array 120, which is a non-volatile memory, and a flash memory buffer 128, which is a volatile memory. FIG. 1 illustrates a single flash memory chip 130 with a single flash memory array 120 and a single flash memory buffer 128 by way of example. Further, the flash memory 116 may include multiple die, each containing an array of memory cells organized into multiple planes, and a volatile memory buffer. Alternatively, the memory cell array may not be divided into planes. In an alternate embodiment, the flash memory chips 130 include the flash memory array 120, and a separate chip may include the flash memory buffer 128.

Functionally, the system controller 118 may include a controller 122, which may comprises a processor, control logic, programmable logic array, or the like. The system controller 118 may also include volatile and non-volatile memory, such as controller firmware 124 and controller RAM 126 (or other volatile memory associated with the controller 122). The mode of the flash memory device may be stored in the memory of the system controller 118 (such as in non-volatile memory). Controller firmware 124 includes instructions which may be executed by controller 122 for coordinating operation of the flash memory 116, such as monitoring for a mode of the flash memory device 102 as discussed below. The system controller 118 may be implemented on a single integrated circuit chip, such as an application specific integrated circuit (ASIC), or may be also be incorporated into flash memory 116.

The memory cells may be operated to store more than two detectable levels of charge in each charge storage element or region, thereby to store more than one bit of data in each. This configuration is referred to as multi-level cell (MLC) memory. Alternatively, the memory cells may be operated to store two levels of charge so that a single bit of data is stored in each cell. This is typically referred to as a binary or single level cell (SLC) memory. Both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material.

Figure 2:
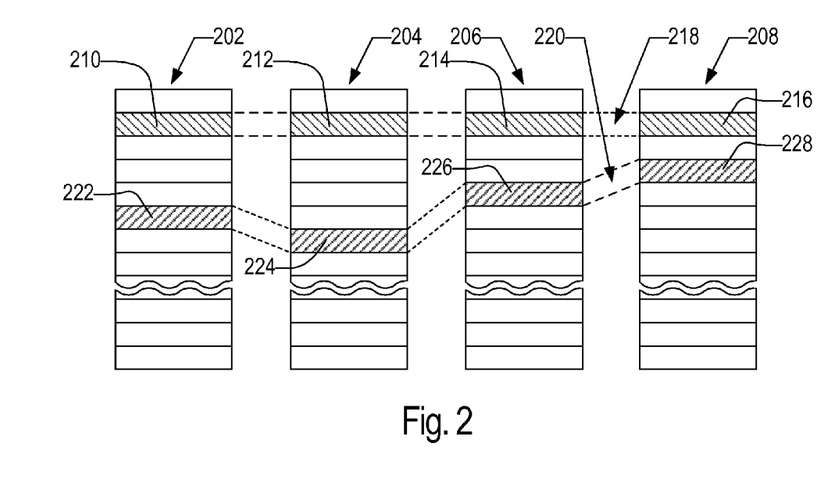
FIG. 2 illustrates an example physical memory organization of the system of FIG. 1.

FIG. 2 conceptually illustrates an organization of the flash memory cell array 120 (FIG. 1) that is used as an example in further descriptions below. The flash memory cell array 120 may include multiple memory cell arrays which are each separately controlled by a single or multiple memory controllers 122. Four planes or sub-arrays 202, 204, 206, and 208 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into groups of memory cells that form the minimum unit of erase, hereinafter referred to as blocks. Blocks of memory cells are shown in FIG. 2 by rectangles, such as blocks 210, 212, 214, and 216, located in respective planes 202, 204, 206, and 208. There can be dozens or hundreds of blocks in each plane.

As mentioned above, the block of memory cells is the unit of erase, the smallest number of memory cells that are physically erasable together. For increased parallelism, however, the blocks are operated in larger metablock units. One block from each plane is logically linked together to form a metablock. The four blocks 210, 212, 214, and 216 are shown to form one metablock 218. All of the cells within a metablock are typically erased together. The blocks used to form a metablock need not be restricted to the same relative locations within their respective planes, as is shown in a second metablock 220 made up of blocks 222, 224, 226, and 228. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 3:
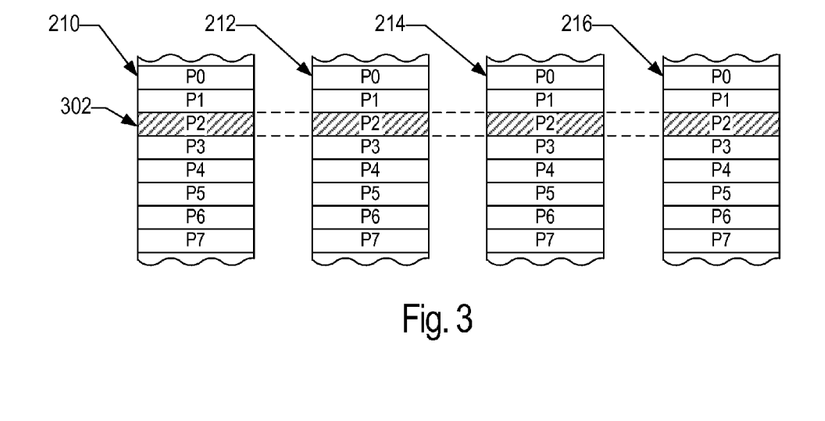
FIG. 3 shows an expanded view of a portion of the physical memory of FIG. 2.

The individual blocks are in turn divided for operational purposes into pages of memory cells, as illustrated in FIG. 3. The memory cells of each of the blocks 210, 212, 214, and 216, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 302 is illustrated in FIG. 3, being formed of one physical page from each of the four blocks 210, 212, 214, and 216. The metapage 302, for example, includes the page P2 in each of the four blocks but the pages of a metapage need not necessarily have the same relative position within each of the blocks. A metapage is the maximum unit of programming.

Figure 4:
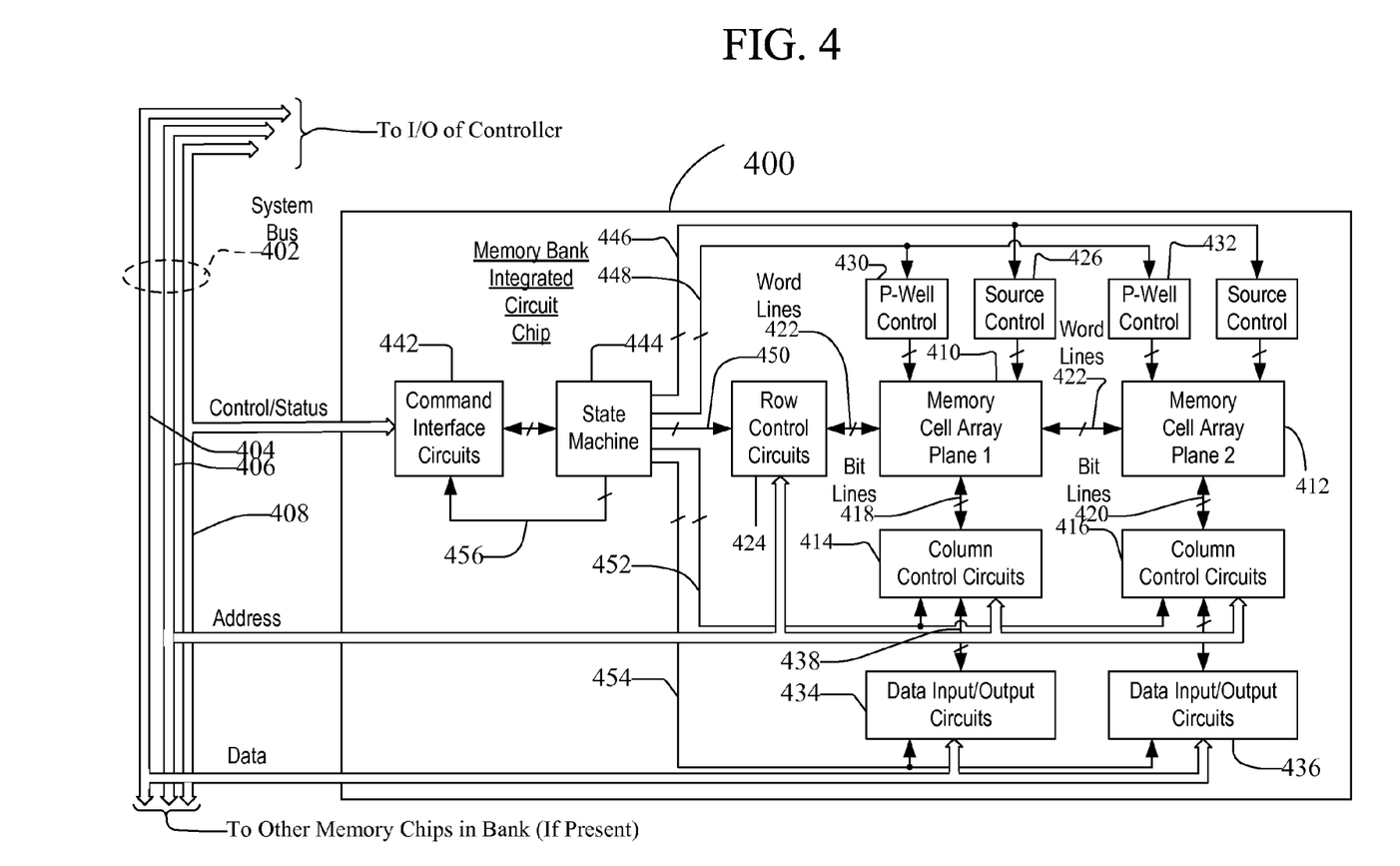
FIG. 4 is an example one flash memory bank suitable as one of the flash memory banks.

Each bank in the multi-bank flash memory may comprise one or more integrated circuit chips, where each chip may contain an array of memory cells organized into multiple planes. An illustration of a memory bank 400 on a single chip is shown in FIG. 4. The memory bank 400 of FIG. 4 shows such planes 410 and 412 for simplicity but a greater number of planes, such as four or eight planes, may instead be used. Alternatively, the memory cell array of a memory bank may not be divided into planes. When so divided, however, each plane has its own column control circuits 414 and 416 that are operable independently of each other. The circuits 414 and 416 receive addresses of their respective memory cell array from the address portion 406 of the system bus 402, and decode them to address a specific one or more of respective bit lines 418 and 420. The wordlines 422 are addressed through row control circuits 424 in response to addresses received on the address bus. Source voltage control circuits 426 and 428 are also connected with the respective planes, as are p-well voltage control circuits 430 and 432. If the bank 400 is in the form of a memory chip with a single array of memory cells, and if two or more such chips exist in the system, the array of each chip may be operated similarly to a plane within the multi-plane chip described above.

Data are transferred into and out of the planes 410 and 412 through respective data input/output circuits 434 and 436 that are connected with the data portion 404 of the system bus 402. The circuits 434 and 436 provide for both programming data into the memory cells and for reading data from the memory cells of their respective planes, through lines 438 and 440 connected to the planes through respective column control circuits 414 and 416.

Each memory chip in each bank contains some controlling circuitry that executes commands from the controller 122 to perform such functions. Interface circuits 442 are connected to the control and status portion 408 of the system bus 402. Commands from the controller 122 are provided to a state machine 444 that then provides specific control of other circuits in order to execute these commands. Control lines 446-454 connect the state machine 444 with these other circuits as shown in FIG. 4. Status information from the state machine 444 is communicated over lines 456 to the interface 442 for transmission to the controller 122 over the bus portion 408.

A NAND architecture of the memory cell arrays 410 and 412 is discussed below, although other non-volatile memory architectures or technologies, alone or combination, such as NOR, can be used instead. An example NAND array is illustrated by the circuit diagram of FIG. 5, which is a portion of the memory cell array 410 of the memory bank 400 of FIG. 4. A large number of global bit lines are provided, only four such lines 502-508 being shown in FIG. 5 for simplicity of explanation. A number of series connected memory cell strings 510-524 are connected between one of these bit lines and a reference potential. Using the memory cell string 514 as representative, a plurality of charge storage memory cells 526-532 are connected in series with select transistors 534 and 536 at either end of the string. When the select transistors of a string are rendered conductive, the string is connected between its bit line and the reference potential. One memory cell within that string is then programmed or read at a time.

Figure 5:
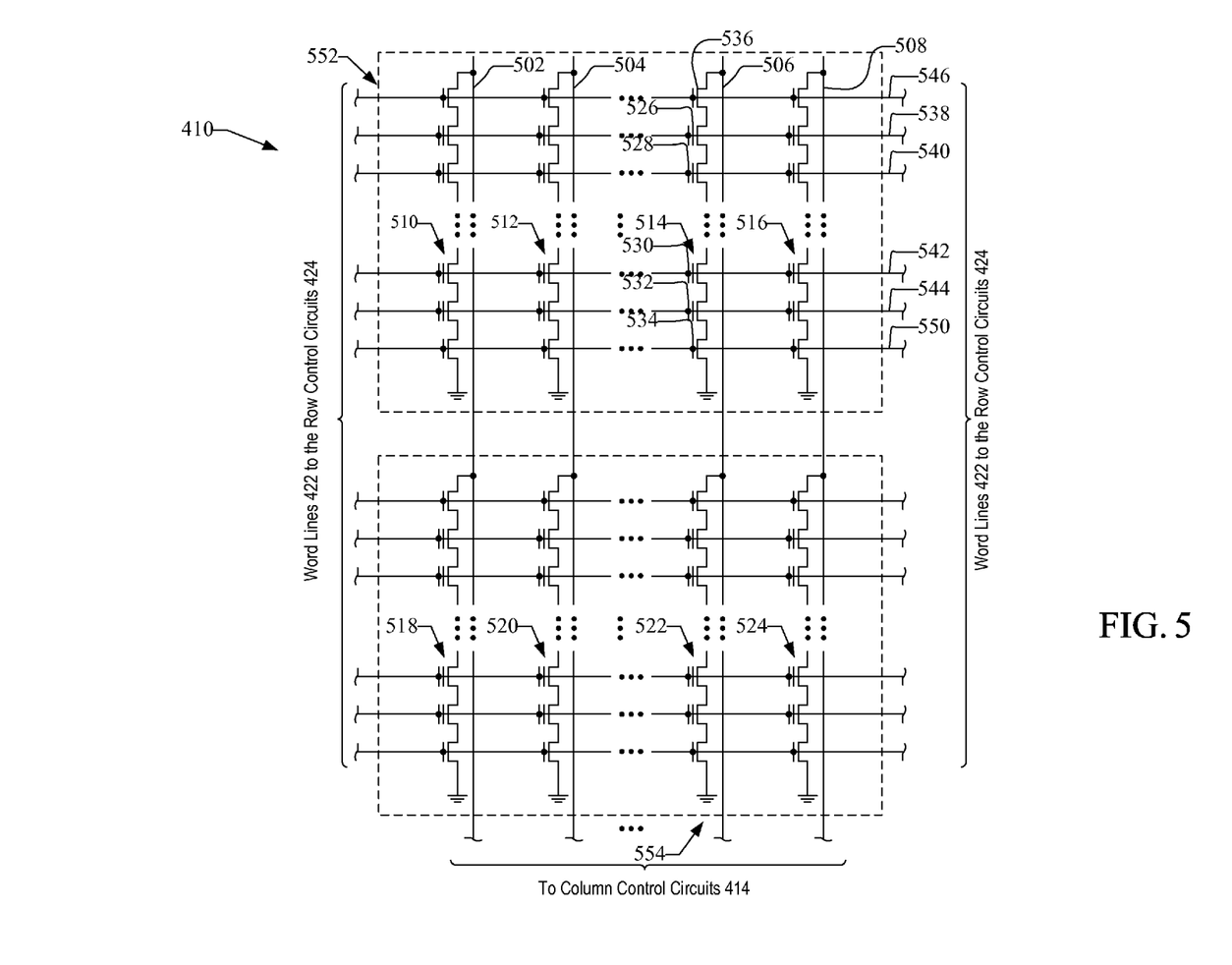
FIG. 5 is a representative circuit diagram of a memory cell array that may be used in the memory bank of FIG. 4.

Wordlines 538-544 of FIG. 5 individually extend across the charge storage element of one memory cell in each of a number of strings of memory cells, and gates 546 and 550 control the states of the select transistors at each end of the strings. The memory cell strings that share common word and control gate lines 538-550 are made to form a block 552 of memory cells that are erased together. This block of cells contains the minimum number of cells that are physically erasable at one time. One row of memory cells, those along one of the wordlines 538-544, are programmed at a time. Typically, the rows of a NAND array are programmed in a prescribed order, in this case beginning with the row along the wordline 544 closest to the end of the strings connected to ground or another common potential. The row of memory cells along the wordline 542 is programmed next, and so on, throughout the block 552. The row along the wordline 538 is programmed last.

A second block 554 is similar, its strings of memory cells being connected to the same global bit lines as the strings in the first block 552 but having a different set of word and control gate lines. The word and control gate lines are driven to their proper operating voltages by the row control circuits 524. If there is more than one plane in the system, such as planes 1 and 2 of FIG. 4, one memory architecture uses common wordlines extending between them. There can alternatively be more than two planes that share common wordlines. In other memory architectures, the wordlines of individual planes are separately driven.

The system controller 118 may control the circuitry discussed with regard to FIGS. 4-5 in order to program planes in parallel. In this way, the system controller 118 of the memory device 102 may configure itself for a programming mode or for a normal mode, as discussed in more detail below.

As discussed above, it is beneficial to minimize the flash memory device's metablock size in order to reduce the system write amplification factor. However, a small metablock size reduces the number of planes that can be operated in parallel, thereby increasing the time in which to program the flash memory device.

Metablock sizes are typically kept smaller in order to comply with various standards, as discussed above. For example, a NAND Flash memory device with a 2 MB block size and four planes would have a metablock size of 8 MB if all of the planes are operated in parallel. Operating the 4 planes of such a flash memory device in parallel is optimal for a manufacturing environment where fast download of content is desired. However, using such a large metablock size after manufacture may not be recommended. As merely one reason, a flash memory device with such a large metablock size may have difficulty meeting the SD speed class benchmark due to the fact that the metablock size is 8 MB and the Secure Digital High Capacity (SDHC) standard atomic unit size is only 4 MB. Thus, in previous flash memory devices, block sizes were kept small (i.e., <=1 MB) so that up to 4 planes could be operated in parallel while still meeting the SDHC standard atomic unit size of 4 MB.

Moreover, for many flash memory devices, it can be shown that the system write amplification (W/A) factor is proportional to the flash memory device's metablock size. Because the flash memory device is erased before it can be rewritten, the process to perform these operations results in moving (or rewriting) user data and metadata more than once. This multiplying effect results in the write amplification in that it increases the number of writes required over the life of the flash memory device, which shortens the time the flash memory device can reliably operate. Therefore, in general, it is beneficial to minimize the flash memory device's metablock size to be as small as possible while still meeting product performance requirements.

However, a small metablock size reduces the number of planes that can be operated in parallel, thereby increasing the time in which to program the flash memory device. This is particularly true in a manufacturing environment in which flash memory devices are pre-loaded with content. The smaller metablock size increases the time to pre-load the content, thereby increasing manufacturing costs.

In one aspect of the invention, the number of physical parallel planes for operation in parallel is dynamic. The flash memory device may include multiple modes, with a different number of physical parallel planes for operation for each of the multiple modes. For example, the flash memory device may have a programming mode and a normal mode, in which more planes are programmed in parallel in the programming mode than in the normal mode. The programming mode may be used at various times during the life of the flash memory device, such as during manufacturing (which may comprise operations during the manufacturing and/or configuration of the flash memory device) and such as during customer operation (which may comprise operations during a large download of data). The normal mode may comprise operations during normal operation by the customer of the flash memory device (with the number of parallel planes equal to the rated standard metapage/metablock, such as the SDHC standard atomic unit size). The flash memory device in the programming mode may have a first number of physical parallel planes for operation in parallel and in the normal mode may have a second number of physical parallel planes for operation in parallel. The number of physical parallel planes for operation in parallel in the programming mode may be greater than the number of physical parallel planes for operation in parallel in the normal mode. For example, the programming mode may allow for maximum performance by operating as many physical planes in the memory device as possible in parallel.

Further, the host system may arrange the data for download based on the flash memory device's mode. For example, the data may be "pre-interleaved" prior to download of the data to the flash memory device. In particular, the host system may receive an indication of the physical parallel plane structure of the flash memory device. The host system may receive the indication in one of several ways. For example, the host system may receive an indication of a type of flash memory device. The host system may access a look-up table (or other type of data construct) in memory 114 that correlates the type of flash memory device to the physical parallel plane structure of the flash memory device (such as the maximum parallel plane structure of the flash memory device). As another example, the host system may receive an indication of the number of physical parallel plane structure.

The host system 100 may receive the indication from the flash memory device, from another device, or by accessing memory 114 of the host system 100. For example, the host system 100 may send a communication to the flash memory device requesting the indication of the physical parallel plane structure and receive a response indicating the physical parallel plane structure. Alternatively, the host system may access a memory location (such as a table) in the host system indicating the physical parallel plane structure of the flash memory device.

The host system may send a communication to the flash memory device in order to configure the flash memory device into the desired mode (such as configure the flash memory device into the increased parallel plane programming mode). In response to receiving the communication, the flash memory device may configure itself accordingly. For example, the system controller 118 of the memory device 102 may receive the communication, and, when programming, control circuitry (such as disclosed in FIGS. 4-5) in order to perform the parallel programming in the programming mode.

Figure 6:
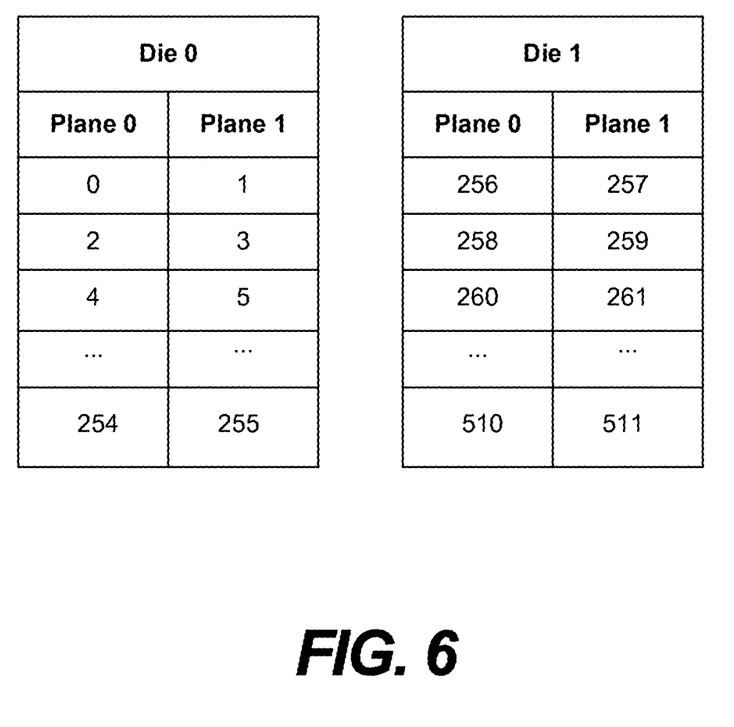
FIG. 6 is a block diagram of planes in different dies.

An example of the pre-interleaving of the download data is illustrated in FIG. 6 of a NAND flash memory device with a block size of 1 MB. FIG. 6 illustrates two die (Die 0 and Die 1), each with two planes and with 256 pages. The two-plane interleaved system would map 8 kB pages as shown in FIG. 6. Without a change of mode, the metablock would only encompass a single die (such as Die 0). So that, parallel programming would only occur with Die 0, while Die 1 would remain idle and would not benefit in the write performance. In this way, 256 pages would be written to Die 0 with only two plane parallelism.

However, in the programming mode, more than a single die may be programmed in parallel. For example, two dies (such as Die 0 and Die 1) may be programmed in parallel. In order to accomplish this, the host system sends data to the flash memory device that has been reorder in order to account for the parallel programming in the programming mode. In the example shown in FIG. 6, there are 512 pages (with the original sequential stream from 0, 1, 2, 3, . . . 510, 511).

Instead of sending the original sequential stream, the host system sends a modified order of the original sequential stream. The modified order is a result of pre-interleaving the original sequential stream, accounting for the parallel programming during increased parallel plane programming mode. In the example shown in FIG. 6, the pre-interleaved order is as follows: 0, 1, 256, 257, 2, 3, 258, 259, 4, 5, 260, 261, . . . 254, 255, 510, 511. So that, each plane in Die 0 and Die 1 may programmed in parallel. The first parallel programming of the planes is pages 0, 1 (from Die 0) and 256, 257

(from Die 1). The second parallel programming of the planes is pages 2, 3 (from Die 0) and 258, 259 (from Die 1), and so on. The pre-interleaving allows for the flash memory device to increase the plane parallelism available without increasing the metablock size during normal customer operations. FIG. 6 illustrates an example of a specific metablock size and a number of planes in parallel. FIG. 6 is merely for illustration purposes. The concept disclosed may be applied to flash memory devices of any block size, any amount of plane parallelism, and/or any number of dies.

Figure 7:
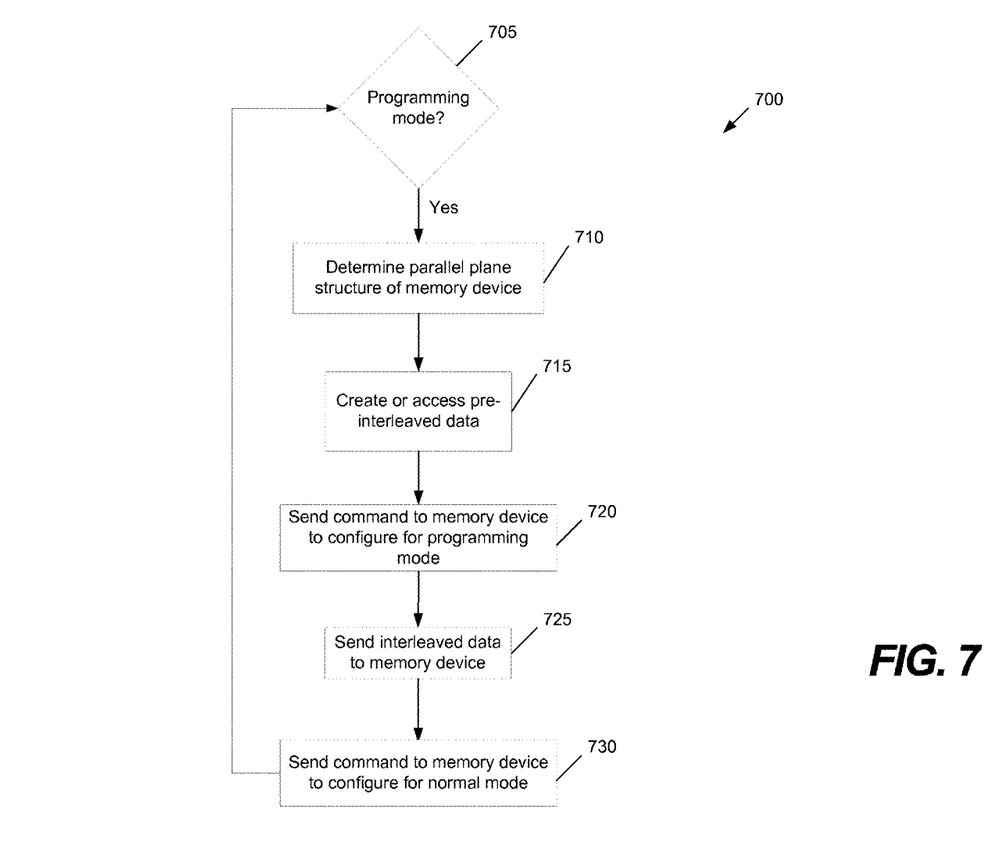
FIG. 7 is a flow diagram illustrating a method of a host system sending interleaved data to the memory device.

FIG. 7 is a flow diagram 700 illustrating a method of a host system sending interleaved data to the memory device. At 705, the host system determines whether to send data to the memory device in programming mode. If so, at 710, the host system determines the parallel plane structure of the memory device in programming mode. As discussed above, the host system may determine the parallel plane structure of the memory device in one of several ways, such as by communicating with the memory device, accessing a memory location of the host device, or communicating with a third party device. At 715, the host system creates or accesses pre-interleaved data. In a manufacturing environment in which a high number of memory devices are programmed, the host system may access pre-interleaved data (either stored in the host device or accessible via a third party device). The pre-interleaved data may thus be used to program the memory devices. Alternatively, when the host system is programming a small number of memory devices, the host system may create the interleaved data in real-time, rearranging the data when it is determined that the data is to be programmed into the memory device. Regardless, at 720, the host system sends a command to the memory device for the memory device to configure itself for programming mode. The memory device's configuration is discussed in more detail in FIG. 8. After which, at 725, the host device sends the interleaved data to the memory device. After sending the interleaved data to the memory device, at 730, the host system may optionally send a command to the memory device to configure itself for normal mode.

Figure 8:
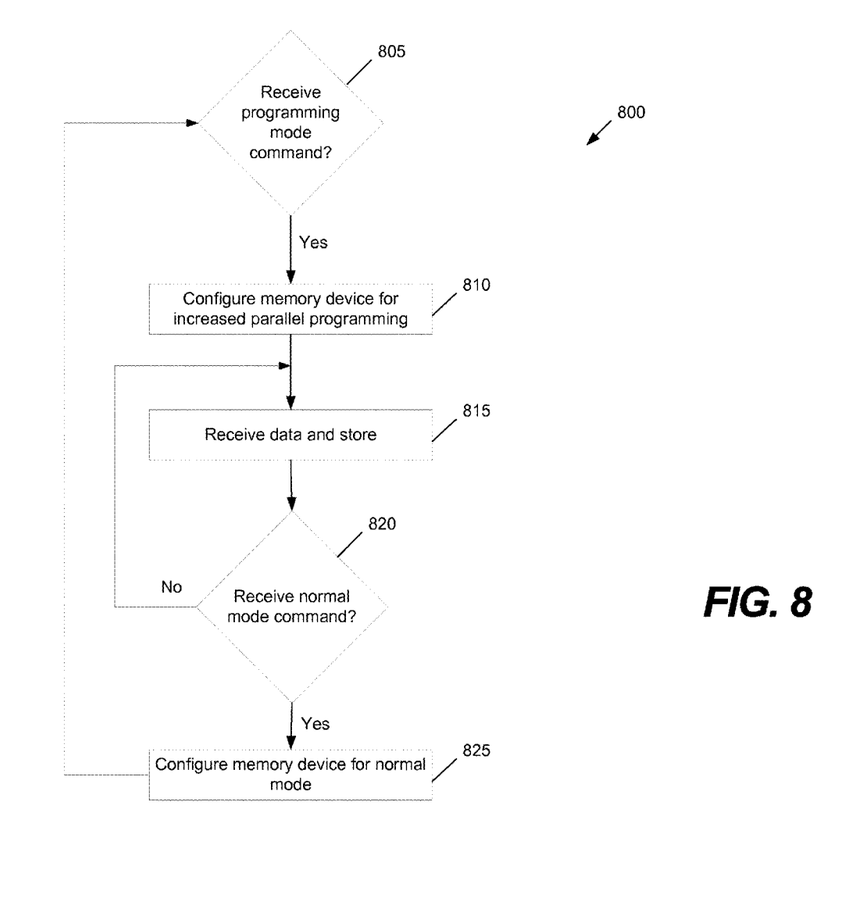
FIG. 8 is a flow diagram illustrating a method of a memory device receiving interleaved data from the host system.

FIG. 8 is a flow diagram 800 illustrating a method of a memory device receiving interleaved data from the host system. At 805, the memory device determines whether it has received a programming mode command. If so, at 810, the memory device configures itself for the programming mode. As discussed above, the memory device may configure itself for programming mode, such as by setting an internal flag in the controller memory (such as controller firmware 124 or controller RAM 126) indicative of the mode being the programming mode. At 815, the memory device receives the data and, based on the internal flag, controls circuitry on the flash memory chip(s) 130 in order to increase the number of planes that are programmed in parallel stores, thereby storing the data according to the configuration in programming mode. At 820, the memory device determines if it has received a normal mode command. If not, the memory device continues to receive and store the data according to the programming mode. If so, at 825, the memory device configures itself for normal mode.

Accordingly, the method and system may be realized in hardware, software, or a combination of hardware and software. The method and system may be realized in a centralized fashion in at least one computer system (such as illustrated in host system 100 in FIG. 1) or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein. Such a programmed computer may be considered a special-purpose computer.

The method and system may also be embedded in a computer program product, which includes all the features enabling the implementation of the operations described herein and which, when loaded in a computer system, is able to carry out these operations. Computer program in the present context means any expression, in any language, code or notation, of a set of instructions intended to cause a system having an information processing capability to perform a particular function, either directly or after either or both of the following: a) conversion to another language, code or notation; b) reproduction in a different material form.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents.

We claim:

1. A method of loading data from a host system into a memory device, the method comprising:
   performing in the host system:
      accessing a programming indicator, the programming indicator indicative of a parallel plane structure of multiple planes in different dies for writing the data to the memory device in a programming mode, wherein the memory device includes a different parallel plane structure for writing the data to the memory device in a normal mode;
      identifying a sequential stream of data for transmission to the memory device, wherein the sequential stream comprises a finite series of sections of data in sequential order;
      using the programming indicator and the identified sequential stream of data in order to obtain interleaved data, the interleaved data comprising a reordering of the sequential stream of data conforming to the parallel plane structure of the multiple planes in the different dies such that the interleaved data comprises sequential data, according to the sequential order of the sequential stream of data, across the multiple planes within the dies and non-sequential data, according to the sequential order of the sequential stream of data, for the multiple planes across the different dies in order for the memory device to write the interleaved data in parallel in the programming mode; and
      sending the interleaved data sequentially to the memory device such that the memory device stores the sequential data, according to the sequential order of the sequential stream of data, across the multiple planes within the dies and the non-sequential data, according to the sequential order of the sequential stream of data, for the multiple planes across the different dies.

2. The method of claim 1, wherein using the programming indicator and the identified sequential stream of data in order to obtain interleaved data comprises:
accessing a memory location using the programming indicator and the identified sequential stream of data in order to obtain the interleaved data.

3. The method of claim 1, wherein using the programming indicator and the identified sequential stream of data in order to obtain interleaved data comprises:
accessing the sequential stream of data; and
reordering the sequential stream of data using the programming indicator in order to generate the interleaved data.

4. The method of claim 1, wherein the programming indicator comprises a type of the memory device; and
further comprising using a data construct to correlate the type of the memory device to a particular parallel plane structure.

5. The method of claim 1, further comprising sending a communication to the memory device, the communication indicative of the programming mode to the memory device in order for the memory device to configure itself to program the interleaved data in the multiple pages across the different dies in parallel according to the programming mode.

6. The method of claim 5, wherein the sequential stream of data comprises a sequential stream of pages;
wherein the different dies comprise a first die and a second die; and
wherein the sequential stream of pages is reordered into the interleaved data such that after the memory device programs the interleaved data in multiple pages across the multiple dies according to the programming mode, the first die and the second die including stored pages in a sequence identical to the sequential stream of pages.

7. The method of claim 5, further comprising sending a second communication to the memory device, the second communication indicative of the normal mode to the memory device in order for the memory device to configure itself to program in a metablock size, the metablock size being smaller than a size of the multiple pages across the different dies in the programming mode.

8. The method of claim 7, wherein the metablock size consists of pages in a single die.

9. The method of claim 1, wherein accessing the programming indicator is in response to a query to the memory device for the parallel plane structure of the memory device.

10. The method of claim 1, wherein the parallel plane structure in the programming mode comprises a first number of physical parallel planes;
wherein the parallel plane structure in the normal mode comprises a second number of physical parallel planes; and
wherein the first number of physical parallel planes is greater than the second number of physical parallel planes.

11. A host system for loading data from the host system into a memory device, the host system comprising:
a memory; and
a controller in communication with the memory, the controller configured to:
access a programming indicator, the programming indicator indicative of a parallel plane structure of multiple planes in different dies for writing the data to the memory device in a programming mode, wherein the memory device includes a different parallel plane structure for writing the data to the memory device in a normal mode;
identify a sequential stream of data for transmission to the memory device, wherein the sequential stream comprises a finite series of sections of data in sequential order;
use the programming indicator and the identified sequential stream of data in order to obtain interleaved data, the interleaved data comprising a reordering of the sequential stream of data conforming to the parallel plane structure of the multiple planes in the different dies such that the interleaved data comprises sequential data, according to the sequential order of the sequential stream of data, across the multiple planes within the dies and non-sequential data, according to the sequential order of the sequential stream of data, for the multiple planes across the different dies in order for the memory device to write the interleaved data in parallel in the programming mode; and
send the interleaved data sequentially to the memory device such that the memory device stores the sequential data, according to the sequential order of the sequential stream of data, across the multiple planes within the dies and the non-sequential data, according to the sequential order of the sequential stream of data, for the multiple planes across the different dies.

12. The host system of claim 11, wherein the controller is configured to use the programming indicator and the identified sequential stream of data in order to obtain interleaved data by accessing the memory using the programming indicator and the identified sequential stream of data in order to obtain the interleaved data.

13. The host system of claim 11, wherein the controller is configured to use the programming indicator and the identified sequential stream of data in order to obtain interleaved data by accessing the sequential stream of data and reordering the sequential stream of data using the programming indicator in order to generate the interleaved data.

14. The host system of claim 11, wherein the programming indicator comprises a type of the memory device; and
wherein the controller is further configured to use a data construct to correlate the type of the memory device to a particular parallel plane structure.

15. The host system of claim 11, wherein the controller is further configured to send a communication to the memory device, the communication indicative of the programming mode to the memory device in order for the memory device to configure itself to program the interleaved data in multiple pages across the different dies in parallel according to the programming mode.

16. The host system of claim 15, wherein the sequential stream of data comprises a sequential stream of pages;
wherein the multiple dies comprise a first die and a second die; and
wherein the sequential stream of pages is reordered into the interleaved data such that after the memory device programs the interleaved data in multiple pages across the different dies according to the programming mode, the first die and the second die including stored pages in a sequence identical to the sequential stream of pages.

17. The host system of claim 15, wherein the controller is further configured to send a second communication to the memory device, the second communication indicative of the normal mode to the memory device in order for the memory device to configure itself to program in a metablock size, the metablock size being smaller than a size of the multiple pages across the different dies in the programming mode.

18. The host system of claim 17, wherein the metablock size consists of pages in a single die.

19. The host system of claim 11, wherein the controller is configured to access the programming indicator is in response to a query to the memory device for the parallel plane structure of the memory device.

20. The host system of claim 11, wherein the parallel plane structure in the programming mode comprises a first number of physical parallel planes;
   wherein the parallel plane structure in the normal mode comprises a second number of physical parallel planes; and
   wherein the first number of physical parallel planes is greater than the second number of physical parallel planes.

\* \* \* \* \*